United States Patent
Brown et al.

(10) Patent No.: US 11,063,118 B1
(45) Date of Patent: Jul. 13, 2021

(54) TERAHERTZ CAPABLE INTEGRATED CIRCUIT

(71) Applicant: Averoses Incorporated, San Francisco, CA (US)

(72) Inventors: Sammy K. Brown, Brunswick, ME (US); John D. Bryant, Los Altos, CA (US); Thomas Brumett, Clayton, NC (US)

(73) Assignee: Averoses Incorporated, San Francisco, CA (US)

( * ) Notice: Subject to any disclaimer, the term of this patent is extended or adjusted under 35 U.S.C. 154(b) by 0 days.

(21) Appl. No.: 15/831,365

(22) Filed: Dec. 4, 2017

Related U.S. Application Data

(60) Provisional application No. 62/429,729, filed on Dec. 2, 2016.

(51) Int. Cl.
| | | |
|---|---|---|
| *H01L 29/06* | (2006.01) |
| *H01L 29/66* | (2006.01) |
| *H01L 51/00* | (2006.01) |
| *B82Y 10/00* | (2011.01) |
| *H01L 29/417* | (2006.01) |
| *H01L 29/423* | (2006.01) |
| *H01L 29/786* | (2006.01) |
| *H01J 9/02* | (2006.01) |
| *H01J 21/00* | (2006.01) |
| *H01L 21/02* | (2006.01) |
| *G01N 21/3581* | (2014.01) |

(52) U.S. Cl.
CPC .......... *H01L 29/0665* (2013.01); *B82Y 10/00* (2013.01); *G01N 21/3581* (2013.01); *H01L 21/02606* (2013.01); *H01L 29/66787* (2013.01); *H01L 51/001* (2013.01); *H01L 51/0048* (2013.01)

(58) Field of Classification Search
CPC .................................................. H01L 29/0665
See application file for complete search history.

(56) References Cited

U.S. PATENT DOCUMENTS

| | | | | |
|---|---|---|---|---|
| 5,204,588 A * | 4/1993 | Ugajin | .............. | H01L 29/66977 315/349 |
| 5,267,884 A * | 12/1993 | Hosogi | .................... | H01J 3/022 445/24 |
| 9,147,755 B1 * | 9/2015 | Han | .................. | H01L 29/66977 |
| 2009/0127592 A1 * | 5/2009 | El-Kareh | ............ | H01L 21/8232 257/262 |
| 2014/0077282 A1 * | 3/2014 | Xu | .......................... | H01L 27/12 257/290 |

(Continued)

OTHER PUBLICATIONS

Bennett, Charles H, and Rolf Landauer. "The fundamental physical limits of computation."Scientific American 253.1 (1985): 48-56. (9 pages).

(Continued)

*Primary Examiner* — Omar F Mojaddedi
(74) *Attorney, Agent, or Firm* — Judith Szepesi

(57) ABSTRACT

A nano-vacuum tube (NVT) transistor comprising a source having a knife edge, a drain, and a channel formed between the source and the drain, the channel having a width to provide a pseudo-vacuum in a normal atmosphere. The NVT transistor utilizing a space charge plasma formed at the knife edge within the channel.

19 Claims, 9 Drawing Sheets

(56) References Cited

U.S. PATENT DOCUMENTS

2014/0128278 A1* 5/2014 Fahmy ............... G01N 33/5438
 506/9
2017/0092778 A1* 3/2017 Zhang ............... H01L 29/78642

OTHER PUBLICATIONS

Han Jin-Woo, Jae Sub Oh, and M Meyyappan. "Vacuum nanoelectronics: Back to the future?—Gate insulated nanoscale vacuum channel transistor." Applied Physics Letters 100.21 (2012) (5 pages).

Haroyan, H. S., Makaryan, A. H., Movsisyan, K. M., & amp; Tadevosyan, V. R. (2012). Electromagnetic Wave Detection Via Interaction With Non-Uniform Distributed Space Charge in Vacuum. J. Phys.: Conf. Ser. Journal of Physics: Conference Series, (6 pages).

Hubler, A. W., & Osuagwu, O. (2010). Digital quantum batteries: Energy and information storage in nanovacuum tube arrays. (17 pages).

Jonsson, P., Ilkov, M., Manolescu, A., Pedersen, A., Valfells, A. (2013). Tunability Atakaramians, Shaghik et al. "Terahertz dielectric waveguides." Advances in Optics and Photonics 5.2 (2013): 169-215.of the terahertz space-charge modulation in a vacuummicrodiode. Physics of Plasmas Phys. Plasmas, 20(2), 023107. (48 pages).

King downloaded Lecture #39 http://www-inst.eecs.berkeley.edu/~ee40/fa03/lecture/lecture39.pdf , Transistor scaling ,Silicon-on-Insulator Technology, Interconnect Scaling (8 pages).

Lee, T. H. (2004). The design of CMOS radio-frequency integrated circuits. Cambridge, UK Cambridge University Press. (2 pages).

Pedersen, A., Manolescu, A., Valfellss, Á. (2010). Space-Charge Modulation in Vacuum Microdiodes at THz Frequencies. Phys. Rev. Lett. Physical Review Letters, 104(17). http :// doi . org /10.1103/physrevlett .104.175002 (4 pages).

Sutter, Herb, downloaded : //www.gotw.ca/publications/concurrency-ddj.htm "The Free Lunch is Over a Fundamental Turn Toward Concurrency in Software" (11pages).

Zou, L., Withayachumnankul, W., Shah, C. M., Mitchell, A., Klemm, M., Bhaskaran, M. Fumeaux, C. (2014). Efficiency and Scalability of Dielectric Resonator Antennas at Optical Frequencies. IEEE Photonics J. IEEE Photonics Journal, 12 pages http://doi.org/10.1109/jphot.2014.2337891 (12 pages).

* cited by examiner

Figure 3A
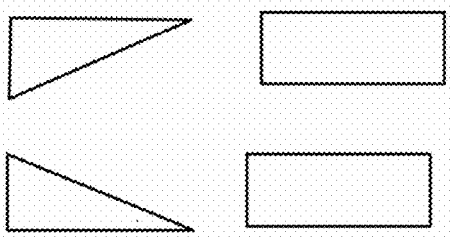
Figure 3B
Figure 3C
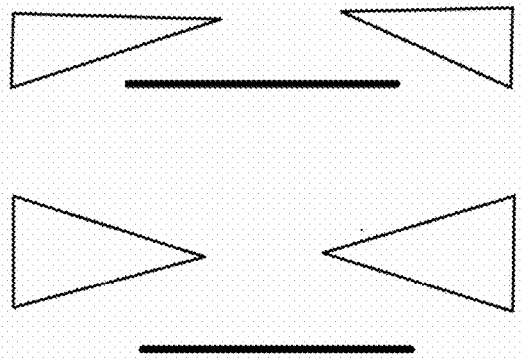
Figure 3D
Figure 3E
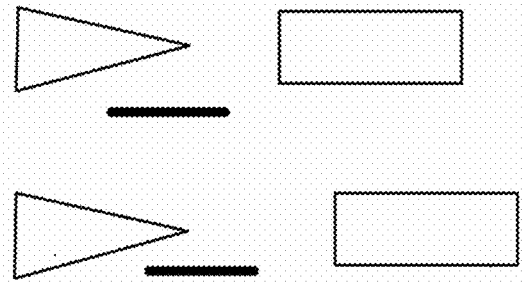
Figure 3F
Figure 3G
Figure 3H
Figure 3I
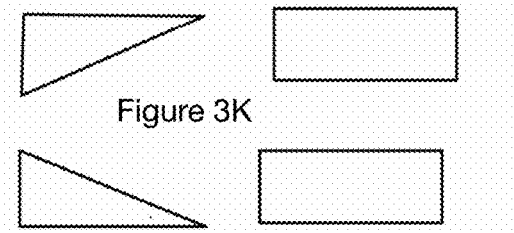
Figure 3J
Figure 3K
Figure 3L

TERAHERTZ CAPABLE INTEGRATED CIRCUIT

RELATED APPLICATION

The present application claims priority to U.S. Provisional Application No. 62/429,729, filed on Dec. 2, 2016 and incorporates that application by reference in its entirety.

FIELD

The present invention relates to integrated circuits, and more particularly to integrated circuits operating in the terahertz region.

BACKGROUND

The terahertz region is the band of frequencies in the 0.1 to 10 THz (wavelengths of 3 mm to 30 μm) region of the electromagnetic spectrum. Currently, there are very few methods of using this range of frequencies, and mass production of devices in this range is considered infeasible. Hence, a gap exists between mature microwave technologies in the lower frequencies of the electromagnetic spectrum and the well-developed optical technologies in infrared wavelengths and higher frequencies of the electromagnetic spectrum. This gap is known as the terahertz gap. Research attempting to fill this gap has been conducted over decades, mostly unsuccessfully.

BRIEF DESCRIPTION OF THE FIGURES

The present invention is illustrated by way of example, and not by way of limitation, in the figures of the accompanying drawings and in which like reference numerals refer to similar elements and in which:

FIG. 3A-3L are diagrams of various configurations of the source, drain, and gate of the system.

DETAILED DESCRIPTION

The present invention is a nano vacuum tube (NVT) transistor in which a source and a drain element form an open channel that is used to create a space charge, which may also be thought of as an electron plasma field, or an electronic gas. The NVT transistor may be used in a lossless transmission line, because the space charge provides lossless or near lossless transmission of electronic signals. In one embodiment, the electrons may move as drift current. This may be used in various systems, including in integrated circuits. As used in the present application, the term "integrated circuit" means circuit elements formed on a substrate, and need not include a processor or other complex structures. The system described herein may be used for transmission lines or interconnects, transistors, capacitors, batteries, and other circuit elements, within a traditional circuit design. In one embodiment, the system may be built on a standard silicon substrate. In one embodiment, non-silicon substrates such as metal, sapphire, or other materials may be used.

This technique can be used in various ways to improve integrated circuit design. This configuration provides a solution for the long known issue of the terahertz gap. Although the terms CMOS and semiconductor are used in this application, it should be clear that the substrate and source and drain need not be made of semiconductor materials. In fact, a variety of materials may be used, ranging from silicon-based materials to diamond-based materials. In one embodiment, the techniques are designed so that current semiconductor fabrication processes may be used without requiring the use of new materials or new processing methodologies, to create the devices described.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1A:
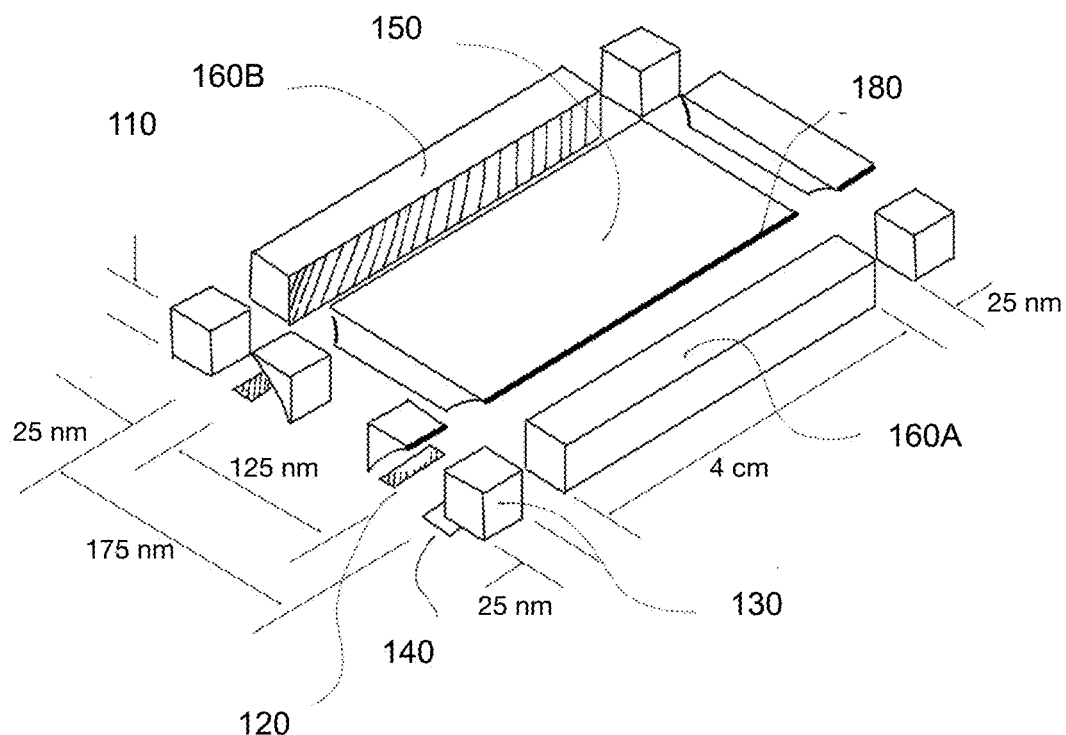
FIG. 1A is a diagram of one embodiment of a twin lead lossless transmission line.

FIG. 1A illustrates one embodiment of a two wire-transmission line. The transmission line is comprised of a plurality of space charge wire configured as a high impedance lossless transmission line. Referring to FIG. 1A two space charge wires are configured as a two-wire transmission line. Each space charge wire inputs and outputs signals through a nano vacuum tube (NVT) transistor. A NVT transistor comprises a source and a drain, with a channel between them. The space between the source and drain forms a channel, in which a space charge forms.

The elements of the transmission line are: source (110), gate (120), drain (130), Miller capacitance shunt (140), channel source (150), channel drain (160A, 160B). The channel source edge (180) is also indicated.

Some of the materials which may be used in manufacturing the transmission line are:

Source: +p low temperature polysilicon, polycrystalline diamond

Gate: SiO2 film deposited over +p polysilicon, or low K over Ti/Copper

Drain: Tungsten film over copper (Ti/Copper), Tungsten or Ti, +Boron polycrystalline diamond Miller capacitance shunt: Al, Ti/copper, tungsten, +Boron polycrystalline diamond Channel Source: +p low temperature polysilicon, polycrystalline diamond Channel Drain: Tungsten film over copper, Tungsten or Ti, +Boron polycrystalline diamond Channel Source edge: SiO2 over +p low temperature polysilicon, polycrystalline diamond The width of the channel is scalable to range from 7 nm to 1000 nm, in one embodiment. The spacing is selected to provide a pseudo-vacuum in normal atmosphere. This occurs when the mean path between the molecules of the atmosphere is comparable to the width of the channel. In one embodiment, at 1 atmosphere the channel size range may be 7 nm to 150 nm. In one embodiment, the channel width may be increased as pressure, density, and/or temperature are decreased.

The bandwidth of the transmission line scales with the space charge plasma frequency. In one embodiment, the channel width is nominally 25 nm and the AC impedance is in the range of 75 ohms. The ratio of the distance between the channels and the width of the channels are the parameters which determine the AC impedance. In one embodiment, for a 75 ohm AC impedance and a 25 nm channel gap, the channel to channel spacing is in the range of 125 nm.

The bandwidth of the space charge in the channel in one embodiment is in the range of 3.5 THz. This is referred to as the plasma frequency of the space charge. The terahertz plasma frequency arises from the enhanced electric field in the nano vacuum channel. For a 25 nm channel gap the enhanced electric field is in the range of 6 Gigavolts/meter for a channel bandwidth in the range of 3.5 THz, which provides an approximately one Terabit data rate.

The transmission line can be monolithically built and integrated on top of conventional copper and low-k interconnect processes. The transmission line can be alternatively added onto the interconnect in CMOS II-ICs. In one embodiment, the transmission line may be built as a stand-alone process for interconnecting so-called 2D IC. Similarly, the process may be used in a 2.5D and 3D ICs. The transmission can be added to a multiplicity of IC products; such as high performance digital processor ICs DRAM memory, Flash memory, and linear ICs.

The design rules for the transmission line process are compatible with standard semiconductor masking processes, in one embodiment. FIGS. 5A-5E below illustrates one embodiment of the manufacturing flow for creating the transmission line, or its derivatives.

The perveance of a space charge device is the ratio of the voltage at the Drain to the current emitted by the Source (cold cathode emitter). For an electron gun, the gun perveance is determined as a coefficient of proportionality between a space-charge limited current and the anode voltage, in three-half power in the Child-Langmuir Law.

Figure 1B:
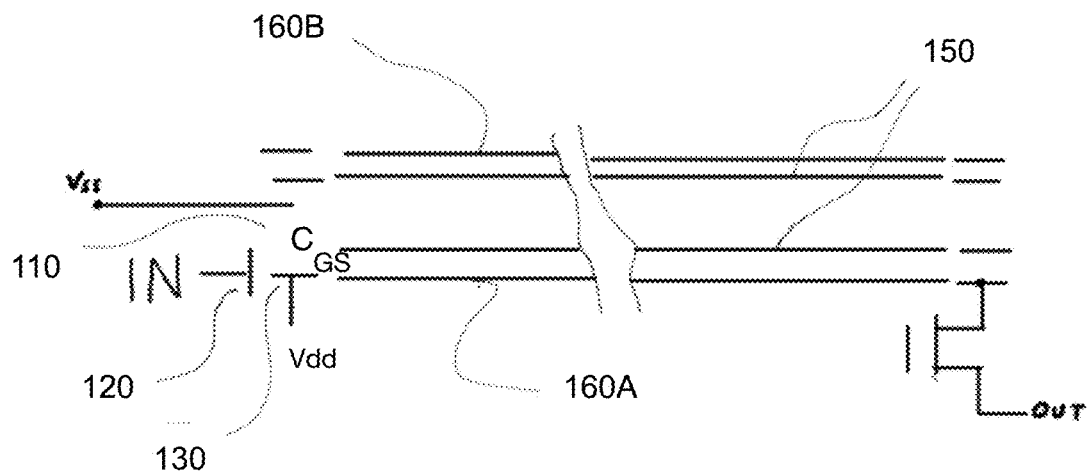
FIG. 1B is a circuit diagram of one embodiment of the twin lead lossless transmission line.

The perveance of each transmission wire is the ratio of the output Drain voltage to current emitted by the input Source cold cathode emitter. The insulated Source and Drain in the channel of the transmission wire act as a strong electrostatic lens compressing the space charge plasma and its corresponding THz bandwidth. The transmission wire may be considered as a long NVT with a multiplicity of electrodes. To utilize the lossless transmission line to carry a signal utilizes a return path in the terahertz range. The return path for the transmission wire is another matched transmission wire. For example, two transmission wires running in parallel form a twin lead long transmission line (LTL). The transmission wire is lossless because the Ohmic resistance is negligible across the transmission line. The signal is carried in the space charge (plasma). By not using a metallic conductor, the skin effect at high frequencies is avoided. This enables the use of longer transmission lines. In this example, the modulation of the input NVT causes a transverse EM wave (a 'light wave) to propagate down the LTL to the output NVT. FIG. 1B is a circuit diagram of one embodiment of the two-channel transmission line.

Figure 2A:
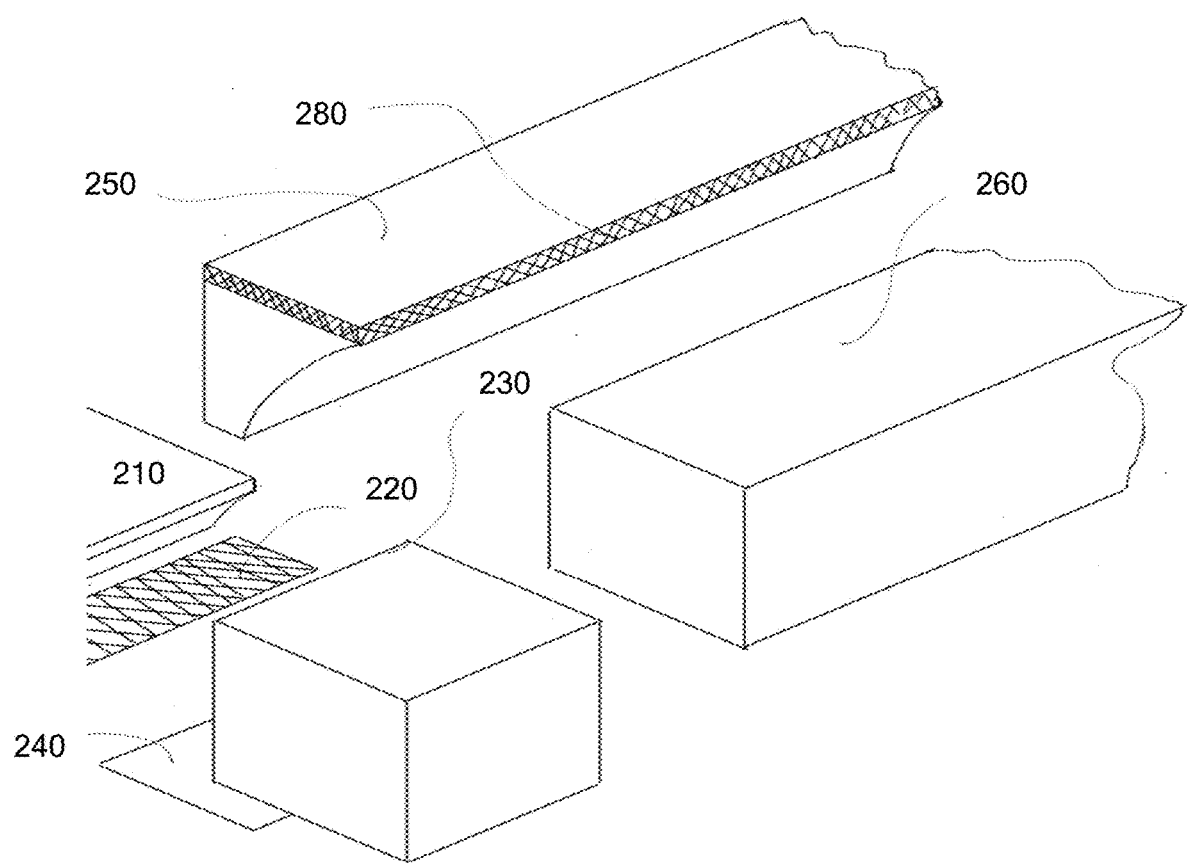
FIG. 2A is a diagram of one embodiment of a nano vacuum tube (NVT) transistor.

FIG. 2A is a diagram of one embodiment of a nano vacuum tube (NVT) transistor and a portion of the space charge wire. The NVT transistor supplies the electron charge for the nano vacuum channel space charge. The NVT also connects the transmission wire to external signals, for example from CMOS logic gates.

The Source edge of the NVT is a lateral nano wire running along the edge of the Source, in one embodiment. The thickness of the edge is in the range of 2 nm to 5 nm, in one embodiment. This optimizes the ratio of the applied field and enhanced electric field (beta β). Using a thinner edge increases the beta β. In on embodiment, the goal is to have a beta R between 50 and 100. The Source edge limits the electric field within the limits of the Source materials tensile and compressive strengths. For example, in a CMOS transmission wire process the Source material is +p polysilicon is in the range of 4 GPa (tensile strength). In another example, a 50 to 100 GPa is realized with a vapor deposition of polycrystalline diamond for the Source material.

The Drain surface is flat, in one embodiment to within 2 nm. The flat surface of the Drain provide quantum suppression of surface voltage breakdown.

The gap between the Source and the Drain forms the channel, which is 25 nm wide, in one embodiment.

In one embodiment, of the NVT the Drain surface is conductive. However in one embodiment, the channel Drain (260) in the nano vacuum channel between the NVTs is insulated to limit leakage of the space charge of the channel. In FIG. 2A, the insulation portion is illustrated with cross-hatching. The cross-hatched portion of the source (280) is insulated as well. An insulated Gate (220) is positioned underneath the Source edge (210). The insulation of the top of the gate is to eliminate leakage current. In one embodiment, the distance from the Source edge to the Gate is nominally equal to the gap distance of 25 nm with the Gate being 25 nm square. In one embodiment, the height of the Source and the Drain are equal so the NVT transistor can be made planar for subsequent layers.

The Source and the Drain of the NVT are isolated from the Source and Drain of the channel so the DC bias voltages can be separated. For a 25 nm process and a SiO2 at 100 MV/m for the dielectric strength, a stand-off voltage can be increased to a nominal 2.5 volts, in one embodiment.

Figure 2B:
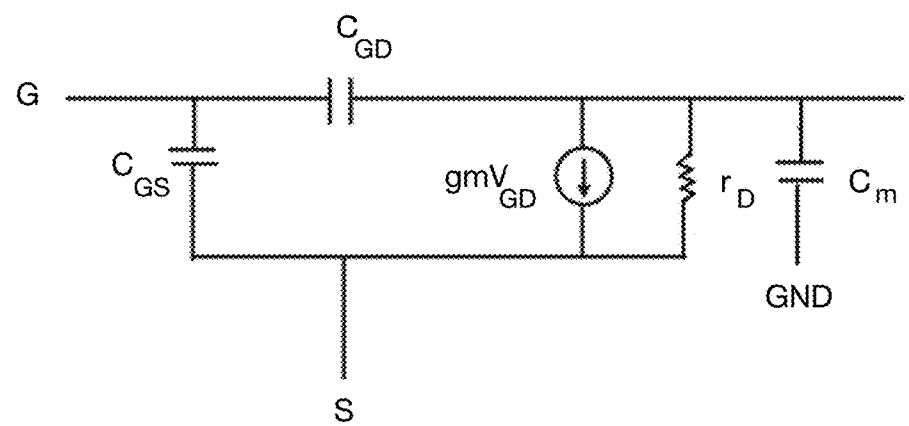
FIG. 2B is a circuit diagram of one embodiment of the NVT transistor.

As shown in the circuit diagram of FIG. 2B, in one embodiment, a Miller capacitance shunt is formed by the Drain and a pad contact to ground to suppress the Miller feedback current into the Gate. This sets the cut-off frequency of the NVT as the space charge frequency. An NVT can have a multiple Sources, or multiple Gates and even multiple Drains and various combinations thereof. For example, a 2 in-out NOR GATE may consist of two separate Gates, a dual output driver with 2 Drains, and a frequency mixer with two Sources.

In one embodiment, the channel Source and the channel Drain are insulated to suppress the Source edge emitting electrons and to suppress leakage current into the Drain. In one embodiment, the insulation may be a few angstroms of SiO2.

The space charge within the transmission wire conductors is continuous with the NVTs.

FIG. 3 illustrates various configurations of the source, drain, and gate. The relative positioning of the elements may vary, as long as the configuration includes a smooth flat drain, a source with a knife edge, and a gate in proximity to the source and drain.

Figure 4:
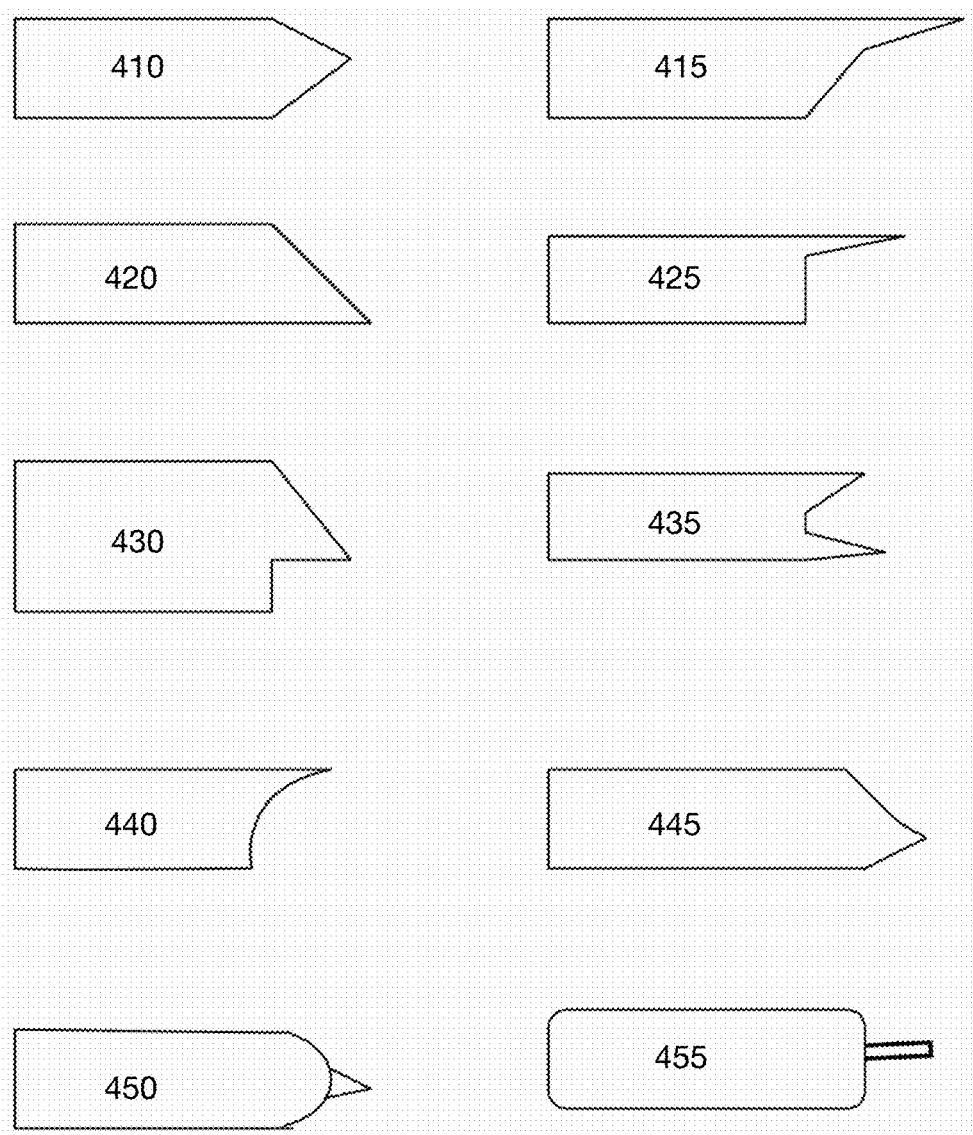
FIG. 4 illustrates various embodiments of the shape of the source to produce the knife edge.

FIG. 4 illustrates various configurations of the source knife edge. As noted above, the knife edge is between 2 nm and 4 nm thick. However, the shape itself may vary. In one embodiment, the shape is defined by the manufacturing process.

Figure 5A:
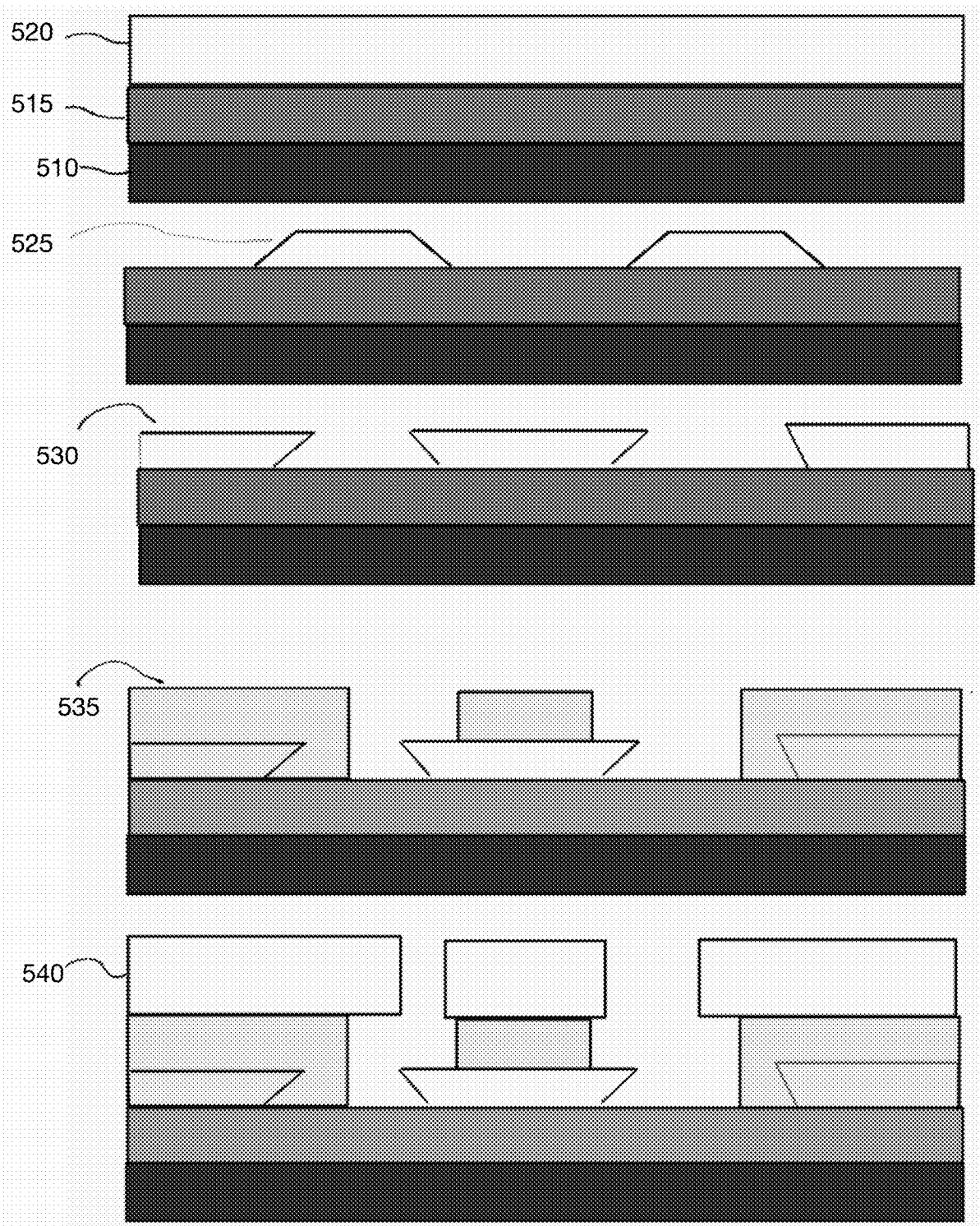
FIG. 5A-5B illustrates one embodiment of the process flow.
Figure 5B:
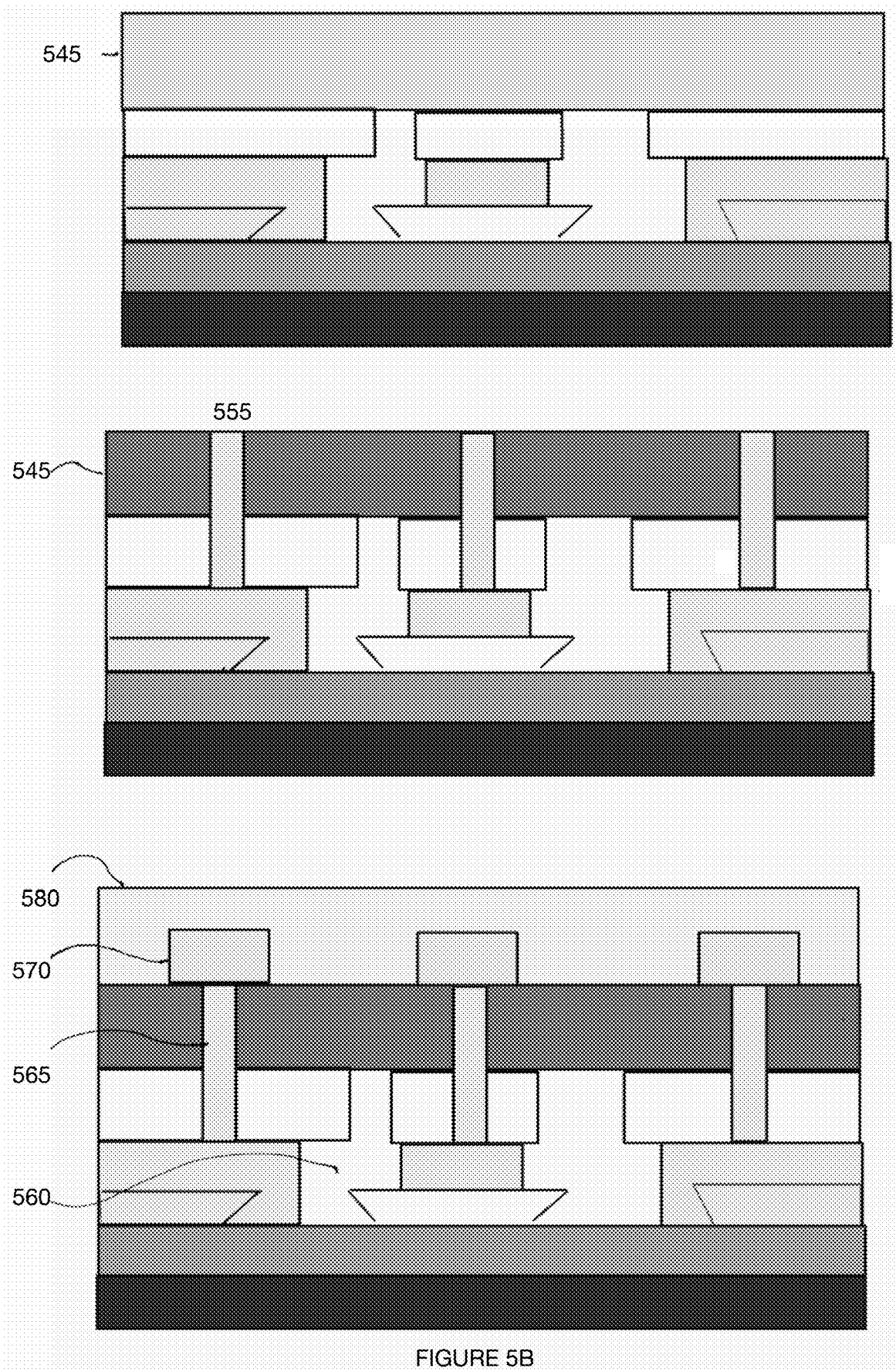

FIG. 5A-5B illustrate one embodiment of the manufacturing process flow for the NVT. The elements are:
- Starting surface Substrate SiO2 (510)
- Source dielectric Low K Polymer (520)
- Source +p polysilicon (530)
- Drain copper (540)
- Channel/Vacuum gap (550)
- Contact copper (560)

In one embodiment, the above process may start on a standard substrate 510. In another embodiment, the process may be built on top of an existing CMOS circuitry, and the substrate may be a top layer of a circuit.

An initial resist 520 is applied to the substrate 515. The resist 520 is etched to produce trapezoids 525. In one embodiment, the trapezoids 525 are isosceles trapezoids. The slope of these resist trapezoids 525 serve as the shaping for the source edge slope. After the resist is etched, a +p polysilicon or other conductive material 530 is deposited, and the resist is removed. In one embodiment, diamond may be used. In one embodiment, the height of the conductive material 530 is 2 nm to 5 nm above the resist trapezoid 525. This shapes the knife edge for the source, discussed above.

A conductive layer 535 is then deposited. The conductive layer 535 in one embodiment is a Ti/Cu layer.

A second layer of insulator 540 is deposited. In one embodiment, the layer is SiO2. In one embodiment, holes are then made in the SiO2, to expose the resist in the air gaps. The material is then etched. The etching removes the lower level resist as well as the insulator. This creates the vacuum air gaps (channel) and exposes the knife edge of the source.

A thin layer 545 is deposited on top of the circuit, with a high enough surface tension to cover the openings in the SiO2 without filling the vacuum air gaps. Because the knife edge is on top of the trapezoid forming the source, a small amount will not damage the circuit. In one embodiment, this is a spin-on coat of polymer. In one embodiment, benzocyclobutene (BCB) may be used. Holes 555 are etched through the polymer 545 and the insulator 540.

The copper contacts 570 are then deposited through cuts made in the polymer and the insulator, to the Drains and the Source. An interconnect layer 580 is put down, connecting the rains and source to bias voltage. In one embodiment, a low-K/Cu standard CMOS interconnect is used. In one embodiment, the bias voltage is a DC bias voltage.

The contact copper 570, positioned on top of the drain, provides a connection between the NVT and the rest of the integrated circuit.

The process described in connection with FIG. 5A-5B results in a fully enclosed channel, between a knife edge Source and a flat drain. This enables further layers, of additional NVT transistors and/or other elements to be built. In another embodiment the channel may be left open to the air. Because of the channel width, whether or not the channel is enclosed, it operates as a pseudo-vacuum. Despite the relatively small sizes of the elements in this NVT transistor, conventional CMOS manufacturing techniques may be used.

Figure 6:
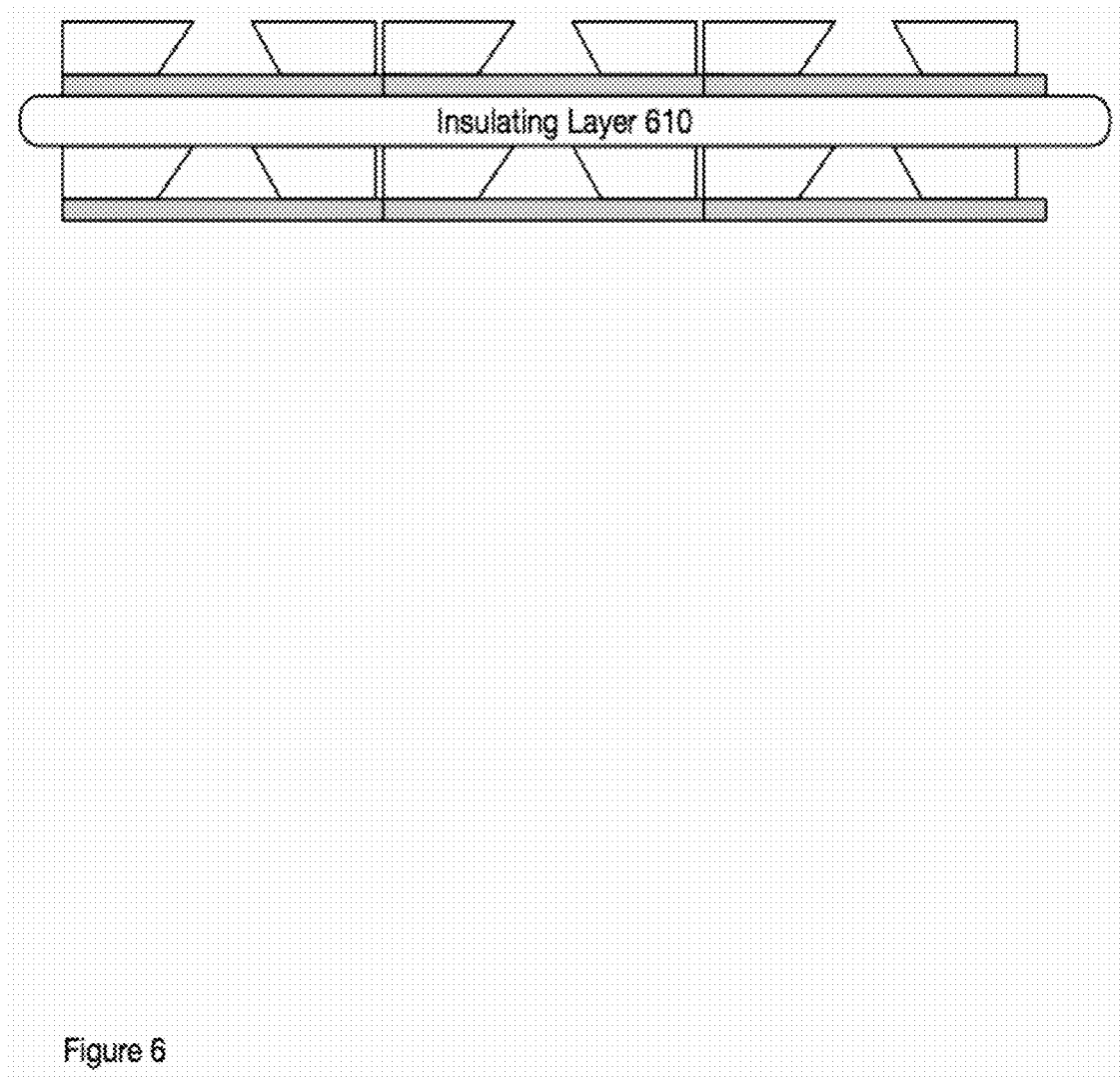
FIG. 6 illustrates one embodiment of a multi-layer transmission line.

FIG. 6 illustrates one embodiment of a multi-layer transmission line. For interconnect, generally there are multiple layers across an integrated circuit. In one embodiment, the transmission lines are layered using a spin coating of a material having the proper surface tension to cover over the channel. In one embodiment, a polymer low k dielectric is used. In one embodiment, layer of CU/low k interconnect is added to connect the DC bias voltages. Advanced CMOS processes can fabricate over 20 layers of either T-wire or CU/low-k interconnect.

Figure 7:
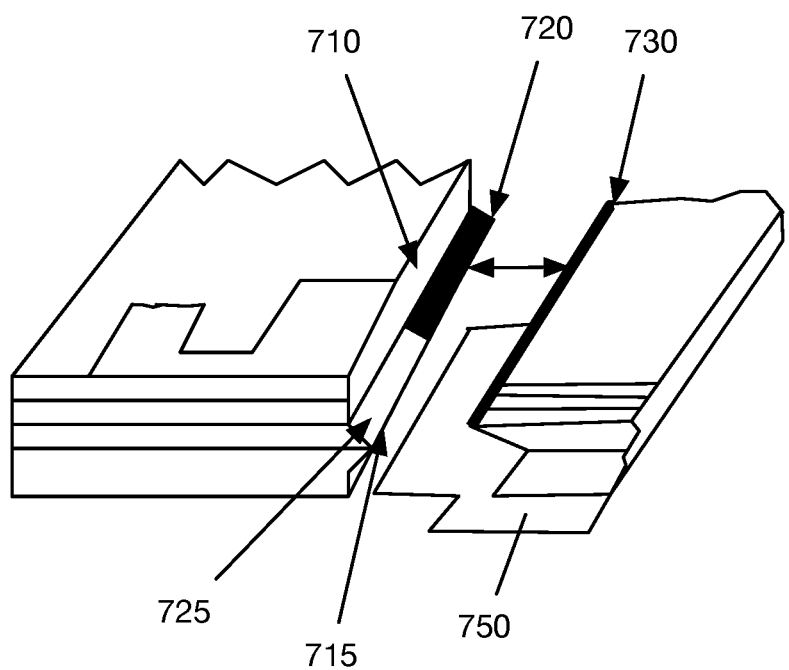
FIG. 7 illustrates one embodiment of the NVT transistor, showing surrounding elements.

FIG. 7 illustrates one embodiment of the NVT transistor showing a cut-away and surrounding elements. There is a source (or cathode) 710 which includes a knife edge 715. The black layer 720 is an insulation layer. The illustration shows that part of the source 710, the portion that is not acting as the emitter, 725 may be covered by an insulation layer 720. The distance between source 710 and drain 730 is distanced 735. The distance from the knife edge 715 of source 710 to the substrate 740 is length L 745. In this instance, the system is shown with both the source 710 and the drain 730 having a similar shape. This may be useful because etching both elements simultaneously means that no additional masking needs to be used. However, this is not necessary for an NST. The source 710 must have the shape including a knife edge 715, with a small radius. The drain 730 may be shaped similarly or differently. The THz response time of the Gate is achieved by making the Gate a so-called nano antenna. in a nano antenna, the THz energy is contained in the dielectric rather than in the metal avoiding the skin effect resistance of metallic conductors.

The nano antenna 750 is used to introduce photons into the space charge plasma generated between source 710 and drain 730. This system, when functioning forms a virtual grid, where the photons hit the space charge region, and manipulate plasma to form virtual electrodes. The signal is modulated using a nano-antenna which is a fraction such as ⅛ of the THz wavelength being introduced. The nano-antenna in one embodiment includes two layers, with a dielectric having a high dielectric constant between the two layers. In one embodiment, the dielectric is a silicon nitride which has low loss and high dielectric constant. This enables the nano-antenna to be 2 microns long in one embodiment.

The space charge region is very sensitive and the injected photons by the nano-antenna are absorbed by the electrons and travel through the channel at light speed. The power density is defined by the amount of injected energy over the volume times mobility. The plasma frequency is proportional to the power density. In one embodiment, for insulation a layer of polycrystalline diamond may be formed on top of the tungsten, or other metal such as copper, aluminum, forming the source. In one embodiment, nano-polycrystalline diamond can be deposited using a CVD process. This reinforces the tungsten. In another embodiment, the entire source and drain structure may be formed using metallic nano-polycrystalline diamond doped with boron. Graphene may also be used as a material. In one embodiment, carbon nano-tubes may be used. In one embodiment, polysilicon may be used as the source, or other common fab metallurgies.

In CMOS and other IC's the transmission wire can replace the low bandwidth copper/low k global interconnect to reduce power consumption in the upper interconnect layers used for digital data buses and clock trees. The transmission wire operating in the gigahertz range reduces its power consumption to as low as 1000 times the Landauer limit (0.0172 eV at room temperature and pressure). A power consumption of 17.2 eV is considered to be the lower limit for reliable digital signal transmission.

In high performance digital applications such as Digital Signal Processors and Microprocessors, the clock timing can be increased to match the picosecond gate propagation times of fine geometry circuits at 25 nm and below.

A segment of a transmission wire biased with the Drain negative to the source forms a high energy and high power density decoupling capacitor for chip-power supply noise reduction.

Figure 8:
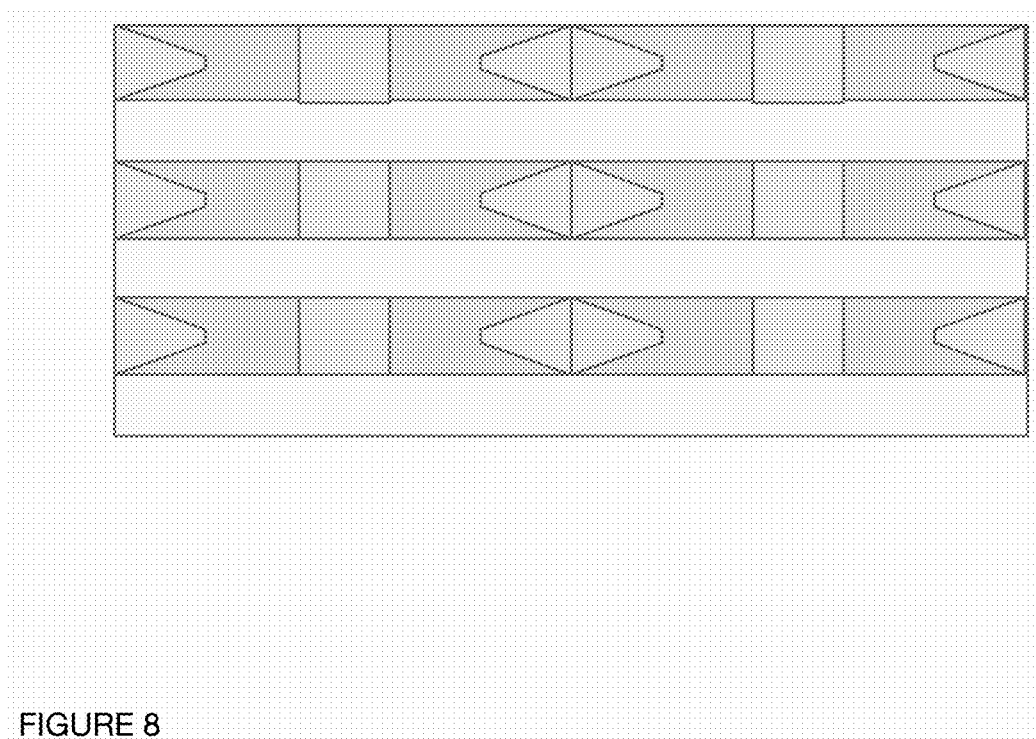
FIG. 8 illustrates one embodiment of a battery which may be built using the NVT transistor.

FIG. 8 is an exemplary battery, stacking NVT transistor devices biased to act as high capacity capacitors in a way to minimize the pressure on the source and drain. The NVT devices which act as capacitors are reverse biased, which creates an electric field that is constrained by the reverse biasing to the channel defined between the source and the drain. The storage capacity is limited by the tensile strength of the material of the source and the drain. By placing two sources back-to-back, and two drains similarly back-to-back the pull between source and drain evens out, and breakdown of the material is less likely. The battery may also be vertically stacked. The insulating layers are designed to leave the air gap between the source and the drain. In this way, capacitive cells can be built up to create a battery which can store power. The limit is the tensile strength of the material making up the source and the drain.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A nano-vacuum tube (NVT) transistor comprising:
   a substrate;
   a source having a horizontal knife edge parallel to and not in contact with the substrate;
   a drain;
   a channel formed between the source and the drain, the channel having a width selected based on a mean path between molecules in an atmosphere, the channel width between 7 nm and 150 nm to provide a pseudo-vacuum in a normal atmosphere; and
   a space charge plasma formed at the horizontal knife edge of the source within the channel.

2. The NVT transistor of claim 1, wherein a thickness of the horizontal knife edge is between 2 nm and 5 nm.

3. The NVT transistor of claim 1, wherein the drain has a flat surface within 2 nm facing the horizontal knife edge of the source.

4. The NVT transistor of claim 1, further comprising:
   a gate positioned under the horizontal knife edge of the source.

5. The NVT transistor of claim 1, wherein the NVT transistor is made using conventional complementary metal oxide semiconductor (CMOS) processing.

6. The NVT transistor of claim 1, wherein the channel width is selected based on a semiconductor manufacturing capability.

7. A nano-vacuum tube (NVT) transistor including a gate, source, and drain, comprising:
   a horizontal knife edge on the source of the NVT transistor, the horizontal knife edge being parallel to and above a substrate;
   a space charge plasma formed at the horizontal knife edge of the source, within a channel defined by the source and the drain, the space charge plasma providing lossless transmission through the NVT transistor in normal atmosphere by having a channel width based on a mean path between molecules in atmosphere, the channel width between 7 nm and 150 nm.

8. The NVT transistor of claim 7, wherein a thickness of the horizontal knife edge is between 2 nm and 5 nm.

9. The NVT transistor of claim 7, wherein the drain has a substantially flat surface facing the horizontal knife edge of the source.

10. The NVT transistor of claim 7, further comprising:
    the gate positioned beneath the horizontal knife edge of the source.

11. The NVT transistor of claim 7, wherein the NVT transistor is made using conventional complementary metal oxide semiconductor (CMOS) processing.

12. The NWT transistor of claim 7, wherein the channel width is selected based on a semiconductor manufacturing capability.

13. A nano-vacuum tube (NVT) transistor comprising:
    a substrate;
    a source having a horizontal knife edge parallel to and above the substrate;
    a horizontal drain positioned in parallel to the source;
    the horizontal knife edge of the source and the horizontal drain defining a channel having a channel width based on a mean path between molecules in atmosphere, the channel width between 7 nm and 150 nm;
    a space charge plasma formed at the horizontal knife edge of the source, within the channel defined by the horizontal knife edge of the source and the horizontal drain, the space charge plasma providing lossless transmission through the NVT transistor without use of a metallic conductor, avoiding skin effect.

14. The NVT transistor of claim 13, further comprising:
    a gate positioned beneath the horizontal knife edge of the source.

15. The NVT transistor of claim 13, wherein the NVT transistor is made using conventional complementary metal oxide semiconductor (CMOS) processing, and the horizontal knife edge of the source is made by depositing a conductive material on a trapezoidal resist layer, and removing the trapezoidal resist layer.

16. The NVT transistor of claim 13, wherein a width of the channel is selected based on a semiconductor manufacturing capability and a mean path between molecules in an atmosphere in which the NVT transistor is operating.

17. The NVT transistor of claim 13, further comprising:
    a thin layer on top of the NVT transistor covering the channel, without filling the channel.

18. The NVT transistor of claim 13, wherein a first conductive material forming the horizontal knife edge of the source is +p polysilicon, and a second conductive material forming the horizontal drain is a Ti/Cu layer.

19. The NVT transistor of claim 13, wherein the channel width is selected within the range of 7 nm and 150 nm based on a semiconductor manufacturing capability.

* * * * *